United States Patent
Yamamoto

(10) Patent No.: US 7,015,143 B2
(45) Date of Patent: Mar. 21, 2006

(54) STRUCTURE INCLUDING MULTIPLE WIRE-LAYERS AND METHODS FOR FORMING THE SAME

(75) Inventor: Sukehiro Yamamoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 231 days.

(21) Appl. No.: 10/309,167

(22) Filed: Dec. 4, 2002

(65) Prior Publication Data

US 2003/0224607 A1 Dec. 4, 2003

(30) Foreign Application Priority Data

Jun. 4, 2002 (JP) ............................. 2002-163515

(51) Int. Cl.
*H01L 21/302* (2006.01)

(52) U.S. Cl. ...................... 438/692; 438/706; 438/710; 438/723; 438/724; 438/618; 438/622; 438/637

(58) Field of Classification Search ................ 438/618, 438/622, 631–633, 637, 692, 697, 699, 771, 438/774, 784, 788
See application file for complete search history.

(56) References Cited

U.S. PATENT DOCUMENTS

| | | | | |
|---|---|---|---|---|
| 5,759,906 A | * | 6/1998 | Lou | 438/623 |
| 6,057,242 A | * | 5/2000 | Kishimoto | 438/692 |
| 6,380,064 B1 | * | 4/2002 | Mizuhara et al. | 438/622 |
| 6,483,162 B1 | * | 11/2002 | Kwon et al. | 257/437 |
| 6,624,061 B1 | * | 9/2003 | Aoki | 438/622 |

FOREIGN PATENT DOCUMENTS

| | | |
|---|---|---|
| JP | 05-121569 | 5/1993 |
| JP | 08-139194 | 5/1996 |
| JP | 08-195437 | 7/1996 |
| JP | 08-335579 | 12/1996 |
| JP | 10-074837 | 3/1998 |
| JP | 11-040666 | 2/1999 |
| JP | 2000-228445 | 8/2000 |
| JP | 2000-306999 | 11/2000 |

OTHER PUBLICATIONS

Wolf, Silicon Processing for the VLSI Era, 2002, Lattice Press, vol. 4, pp. 313;315;385;639;655;663;680.*
Wolf, Silicon Processing for the VLSI Era, 1990, Lattice Press, vol. 2, pp. 222-223, 226.*
Wolf et al., Silicon Processing for the VLSI Era, 1986, Lattice Press, vol. 1, pp. 191-192.*
Wolf, Silicon Processing for the VLSI Era, 2002, Lattice Press, vol. 4, pp. 720-721.*

* cited by examiner

*Primary Examiner*—Nadine G. Norton
*Assistant Examiner*—Eric B. Chen
(74) *Attorney, Agent, or Firm*—Volentine Francos & Whitt, PLLC

(57) ABSTRACT

A method for forming a structure including multiple wire-layers, the method including providing a plurality of first wires (in a layer) on an underlying layer; providing a liner insulating film on the underlying layer so as to coat the first wires and have concave portions respectively between the mutually adjacent first wires; providing a buried insulating film in the concave portions and on the liner insulating film; providing a cap insulating film so as to coat the buried insulating film; and providing a second wire layer on or above the cap insulating film. The buried insulating film is made of an insulating material having a dielectric constant, which is lower than that of the liner insulating film and the cap insulating film.

20 Claims, 7 Drawing Sheets

STRUCTURE INCLUDING MULTIPLE WIRE-LAYERS AND METHODS FOR FORMING THE SAME

BACKGROUND OF THE INVENTION

1. Field of the Invention

The present invention relates to a structure including multiple wire-layers, and particularly to a structure including multiple wire-layers, which is suitable for using in a semiconductor device.

2. Description of the Related Art

FIG. 5 is a schematic cross-sectional view showing a general example of a conventional structure including multiple wire-layers, in which an upper wire-layer and a lower wire-layer are electrically connected to each other via members embedded in via-holes.

As shown in FIG. 5, first wires (in a layer) 112 are provided on an underlying layer 111, and an inter-layer insulating film 120 is provided so as to coat the first wires 112. The inter-layer insulating film 120 comprises a liner insulating film 122 which is provided on the underlying layer 111 and the first wires 112, buried insulating films 124 which are provided on the liner insulating film 122 and respectively between the mutually adjacent first wires 112, and a cap insulating film 126 which is further provided on the buried insulating films 124 and the liner insulating film 122.

Second wires (in a layer) 114 are provided on the inter-layer insulating film 120. Further, via-holes are formed so as to pass through the inter-layer insulating film 120, and the first wires 112 and the second wires 114 are electrically connected to each other via conductive members 117 embedded in the via-holes.

In the above-described conventional structure including multiple wire-layers, because a material having a large dielectric constant within a range from 4.0 to 5.4 is used especially for the buried insulating films, capacitance between the upper wire-layer and the lower wire-layer increases. As a result, operation speed of the semiconductor device using the structure including multiple wire-layers is slowed, and further, electric power consumption and reliability of the semiconductor device are disadvantageously affected.

Further, because of high integration in the semiconductor device based on a refined design rule for an improved fabrication process, capacitance between the mutually adjacent wires in the same layer (fringing capacitance) increases. This also disadvantageously affects the semiconductor device in the above-described manner.

Thus, a structure including multiple wire-layers, in which the capacitance between the wires in different layers and between those in the same layer can be reduced, has been desired.

SUMMARY OF THE INVENTION

It is an object of the present invention to solve the above-described problems. A structure including multiple wire-layers according to the present invention comprises an underlying layer and a plurality of first wires (in a layer) provided thereon. The structure including multiple wire-layers further comprises a liner insulating film, which is provided on the underlying layer so as to coat the first wires and have concave portions respectively between the mutually adjacent first wires, a buried insulating film, which is provided in the concave portions/on the liner insulating film, and a cap insulating film, which is provided so as to coat the buried insulating film. A second wire layer is further provided on/above the cap insulating film. Namely, the liner insulating film, the buried insulating film, and the cap insulating film are provided as an inter-layer insulating film.

The buried insulating film is made of an insulating material having a dielectric constant, which is lower than that of the liner insulating film and the cap insulating film.

In the structure including multiple wire-layers according to the present invention, since the buried insulating film, whose dielectric constant is lower than that of the other films forming the inter-layer insulating film, is provided in the inter-layer insulating film and between the wires in different layers, capacitance therebetween can be reduced. Further, since the buried insulating film is provided in the inter-layer insulating film and between the mutually adjacent wires in the same layer, capacitance therebetween (fringing capacitance) can be also reduced.

A first aspect of the present invention is a method for forming a structure including multiple wire-layers, the method comprising steps of: preparing an underlying layer; providing a plurality of first wires on the underlying layer; forming a liner insulating film on the underlying layer provided with the plurality of first wires, so that concave portions are respectively formed between the first wires, which are adjacent to each other, and so that convex portions are respectively formed on the first wires; providing an insulating material on the liner insulating film; planarizing a top surface of the insulating material so that the convex portions are exposed and the insulating material is left in the concave portions, so as to form buried insulating films; providing an insulating material so as to coat the exposed liner insulating film and the buried insulating films; planarizing a top surface of the insulating material so that the convex portions are exposed and the buried insulating films are coated, so as to form cap insulating films; forming via-holes that pass through the liner insulating film so as to reach the first wires, and filling the via-holes with conductive embedded members; and providing second wires so as to be electrically connected to the first wires via the embedded members; wherein a dielectric constant of the insulating material for the buried insulating films is lower than that of the liner insulating film and the cap insulating films.

A second aspect of the present invention is a method for forming a structure including multiple wire-layers, the method comprising steps of: preparing an underlying layer; providing a plurality of first wires on the underlying layer; forming a liner insulating film on the underlying layer provided with the plurality of first wires, so that concave portions are respectively formed between the first wires, which are adjacent to each other, and so that convex portions are respectively formed on the first wires; providing a first insulating material on the liner insulating film; planarizing a top surface of the first insulating material to form a buried insulating film; forming a cap insulating film so as to coat the buried insulating film; forming via-holes that pass through the cap insulating film, the buried insulating film, and the liner insulating film so as to reach the first wires; filling the via-holes and coating a top surface of the cap insulating film with a second insulating material; etching the second insulating material so as to form side walls at side portions of the via-holes and to expose top surfaces of the first wires at bottom portions of the via-holes; filling the via-holes with conductive embedded members; and providing a second wire layer so as to be electrically connected to the first wires via the embedded members; wherein a dielectric constant of the insulating material for the buried insulating film is lower than that of the liner insulating film and the cap insulating film.

DESCRIPTION OF THE PREFERRED EMBODIMENTS

Figure 1:
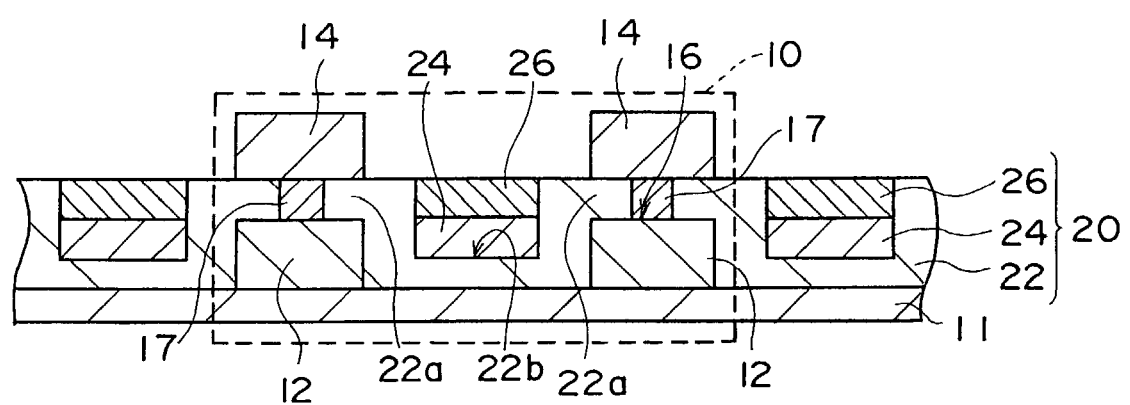
FIG. 1 is a schematic cross-sectional view showing a structure including multiple wire-layers in a first embodiment of the present invention.

Hereinafter, embodiments of the present invention will be described referring to drawings. The drawings are merely intended to schematically show shape, size and positional relation of the respective components to such a degree that the present invention can be understood, and thus are not intended to limit the present invention to the examples shown in the drawings. It should be understood that the same components are referred to using the same reference numerals in the drawings and description thereof may be omitted. An example in which the structure including multiple wire-layers is used in a semiconductor device will be described below.

First Embodiment

FIG. 1 is a schematic cross-sectional view showing a semiconductor device in a first embodiment.

The semiconductor device of the present invention has a structure 10 including multiple wire-layers. In the structure 10 including multiple wire-layers, a plurality of first wires 12 are provided on an underlying layer 11. The plurality of first wires 12 are included in the same layer.

It is supposed that the underlying layer 11 has a structure including, for example, an element region provided on a silicon substrate, a field insulating film for insulating the element region from the first wires 12 provided above, contact holes for connecting the element region to the first wires 12, and members embedded in the contact holes. However, the underlying layer 11 is not limited to this, and may be a flexible substrate or the like. As the structure of the underlying layer 11 deviates from a main object of the present invention, illustration and description thereof will be omitted.

An inter-layer insulating film 20 is provided on the first wires 12 and the underlying layer 11. Second wires 14 are provided on the inter-layer insulating film 20.

The inter-layer insulating film 20 comprises a liner insulating film 22, buried insulating films 24 and cap insulating films 26. The surface of the liner insulating film 22 is uneven, because the plurality of first wires 12 are provided on the underlying layer 11. Specifically, the liner insulating film 22 coats the underlying layer 11 and the first wires 12 provided thereon so as to have concave portions 22*b* respectively between the mutually adjacent first wires 12. Thus, portions of the liner insulating film 22, which locate on the first wires 12, form convex portions 22*a*, and portions thereof, which locate respectively between the mutually adjacent first wires 12, form the concave portions 22*b*. The buried insulating films 24 are respectively provided in the concave portions 22*b*. The cap insulating films 26 respectively coat the buried insulating films 24.

The thickness of the buried insulating films 24 provided in the concave portions 22*b* is preferably thinner than the depth of the concave portions 22*b*.

In this case, the buried insulating films 24 can be more reliably buried in the inter-layer insulating film 20.

The first wires 12 and the second wires 14 are made of a conductive material. The material is not particularly limited, but is preferably a metal such as gold, aluminum or copper.

Materials for the liner insulating film 22 and the cap insulating films 26 forming the inter-layer insulating film 20 are also not particularly limited, and can be properly selected from conventionally used materials as long as their use does not hinder the object of the present invention. Specifically, a material for the liner insulating film 22 is preferably selected from insulating materials with excellent coatability, and that for the cap insulating films 26 is preferably selected from insulating materials with excellent embeddability. The materials for the liner insulating film 22 and the cap insulating films 26 may be the same. Specifically, the liner insulating film 22 and the cap insulating films 26 are preferably P-TEOS films, for example.

An insulating material having a dielectric constant, which is lower than that of insulating materials used for buried insulating films in prior art, and than that of insulating materials used for the liner insulating film 22 and the cap insulating films 26 in the vicinities of the buried insulating films 24, is used for forming the buried insulating films 24. The dielectric constant of the insulating material for the buried insulating films 24 is preferably as low as possible. However, taking into consideration availability of the insulating material, the dielectric constant is preferably within a range from 2.0 to 3.3, for example.

Specifically, preferable examples of the insulating material for the buried insulating films 24 include insulating materials containing fluorine (FSG), a borazine-silicon polymer and the like. More preferably, the insulating material for the buried insulating films 24 is selected from the insulating materials containing fluorine (FSG).

The FSG is excellent in both coatability and embeddability, and thus, the thickness of the FSG to be deposited can be determined to be thin. As a result, time for a step of forming the buried insulating films 24 can be shortened.

Via-holes 16 are formed so as to pass through the inter-layer insulating film 20. Embedded members 17 for electrically connecting the first wires 12 to the second wires 14 are respectively provided in the via-holes 16. A material for the embedded members 17 is preferably tungsten (W).

A method for fabricating the semiconductor device in the first embodiment of the present invention will now be described referring to FIGS. 2A to 2G.

FIGS. 2A to 2G are intended to explain each step of fabricating the semiconductor device (structure including multiple wire-layers) in the first embodiment. These figures show cross-sections of the structure obtained at each step.

In accordance with the method for fabricating the semiconductor device (structure including multiple wire-layers) in the first embodiment of the present invention, initially, the first wires 12 are provided on the underlying layer 11.

Figure 2A:
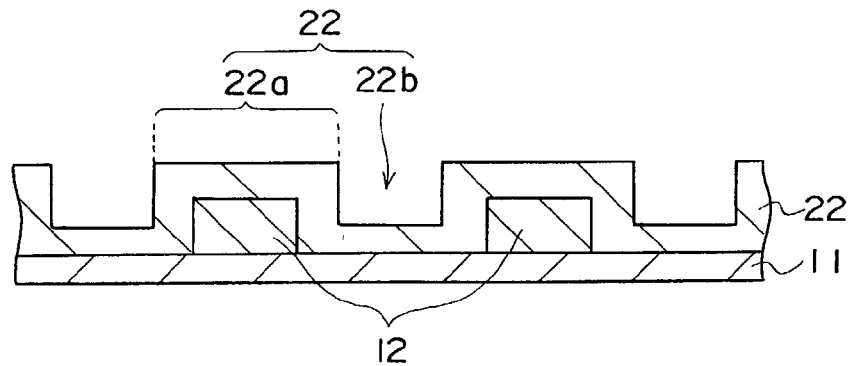
FIGS. 2A to 2G are cross-sectional views showing each step of a method for forming the structure including multiple wire-layers shown in FIG. 1.

The liner insulating film 22 is then provided on the underlying layer 11 so as to coat the first wires 12 (FIG. 2A).

At this time, portions of the liner insulating film 22, under which the first wires 12 exist, are raised to form the convex portions 22a, and portions thereof, under which the first wires 12 do not exist, are extended along the underlying layer 11 to form the concave portions 22b. In this manner, the top surface of the liner insulating film 22 formed on the first wires 12 and the underlying layer 11 is uneven.

Figure 2B:
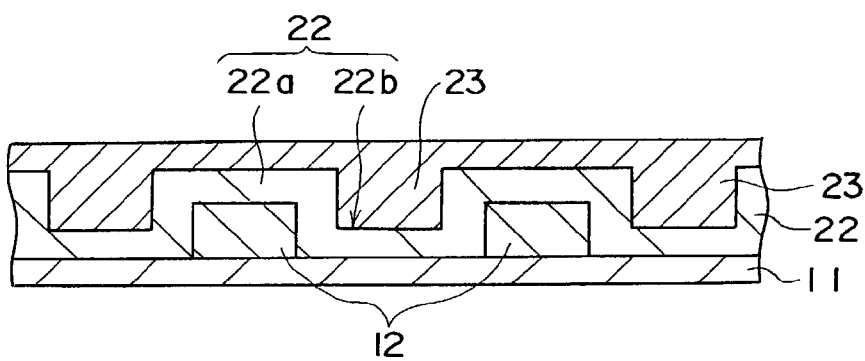

Further, the liner insulating film 22 is coated with a first preliminary layer 23 (FIG. 2B).

The first preliminary layer 23 is an insulating material layer for forming the buried insulating films 24 (see FIG. 2D), and the top surface thereof is preferably even. The dielectric constant of the first preliminary layer 23 is determined to be lower than that of the liner insulating film 22 and that of the cap insulating films 26 which will be formed after the buried insulating films 24 are formed. The dielectric constant of the first preliminary layer 23 is preferably within a range from 2.0 to 3.3.

These steps can be achieved by conventionally used processings for fabricating the semiconductor device, for example, by using photolithography technique, film-deposition technique or the like. As the processings are not a main object of the present invention, detailed description thereof will be omitted here (and hereinafter as well).

Figure 2C:
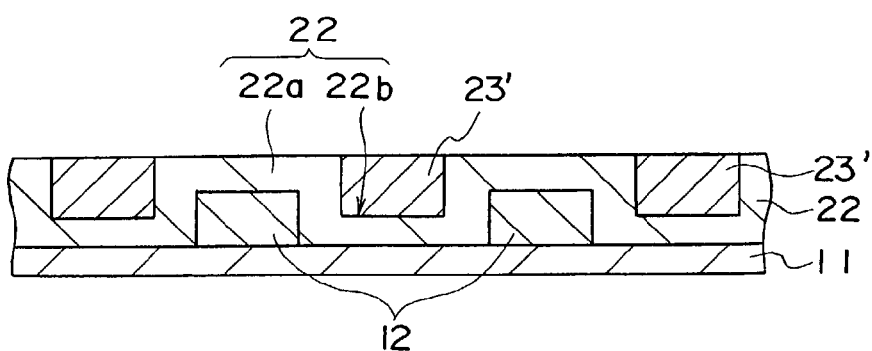

Next, the overall upper surface portion of the first preliminary layer 23 for forming the buried insulating films 24 is removed until the top surfaces of the convex portions 22a of the liner insulating film 22 are exposed, such that residues 23' of the first preliminary layer 23 are respectively left in the concave portions 22b of the liner insulating film 22, and then, the top surfaces of the residues 23' are planarized to be continuous with the top surfaces of the convex portions 22a (FIG. 2C).

The step of planarizing can be achieved by using a well-known method, for example, a chemical mechanical polishing (CMP) method or an etch back method.

Figure 2D:
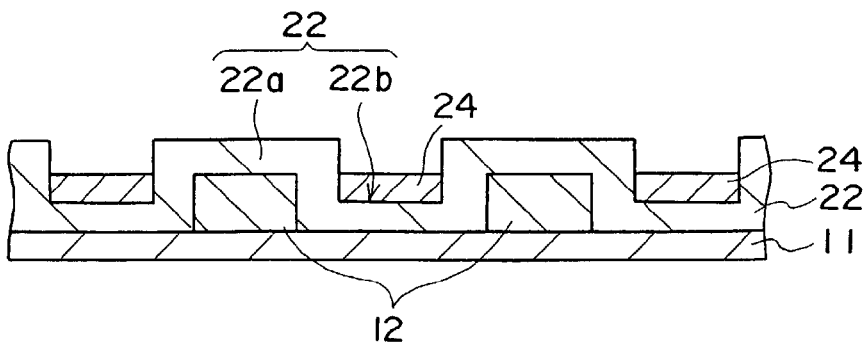

Further, the thickness of the residues 23' of the first preliminary layer 23, which have been left in the concave portions 22b of the liner insulating film 22, is reduced by anisotropic etching, preferably so as to be thinner than the depth of the concave portions 22b to form the buried insulating films 24 (FIG. 2D).

It is an object of this step to bury the buried insulating films 24 between the liner insulating film 22 and the cap insulating films 26 which will be formed later on the buried insulating films 24, in the inter-layer insulating film 20. For example, in the case where the buried insulating films 24 are made of an insulating material containing fluorine as described above, there is a risk that the fluorine leaks out and corrodes the metal forming the first wires 12 and/or the second wires 14, thereby resulting in operation failure of the semiconductor device. Therefore, in order to avoid the risk, the buried insulating films 24 should be made thin in advance so that the cap insulating films 26, which will be formed later to bury the buried insulating films 24 into the inter-layer insulating film 20, can be made thick.

Specific amount of the anisotropic etching, in other words, the thickness of the buried insulating films 24 which have been etched, can be properly determined as long as it does not hinder the object of the present invention. For example, the thickness of the buried insulating films 24 should be made thin to such a degree that a corrosion factor such as the above-mentioned fluorine is prevented from leaking out and that effects obtained by using an insulating material having a low dielectric constant are not obstructed.

Figure 2E:
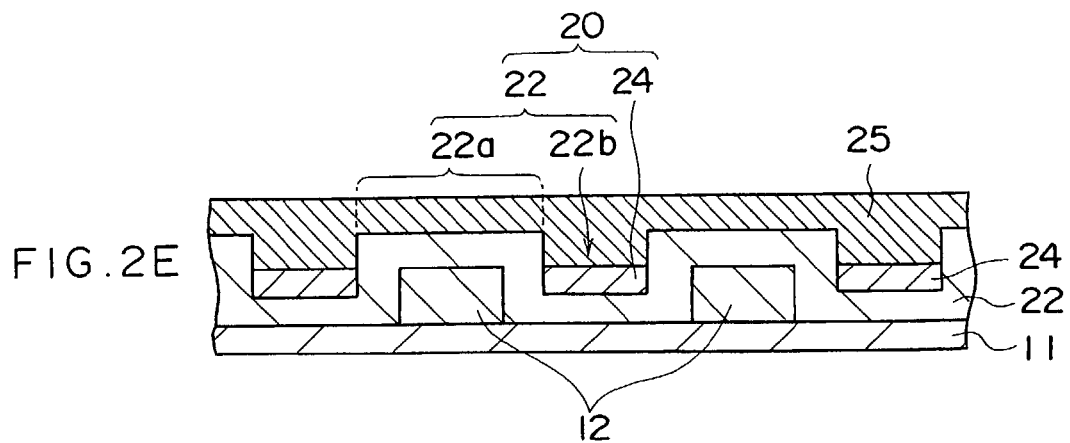

Next, the liner insulating film 22 and the buried insulating films 24, which are exposed, are coated with a second preliminary layer 25 for forming the cap insulating films 26 (FIG. 2E). At this time, the top surface of the second preliminary layer 25 is preferably even. The dielectric constant of the cap insulating films 26 is determined to be higher than that of the buried insulating films 24, i.e., that of the first preliminary layer 23.

Figure 2F:
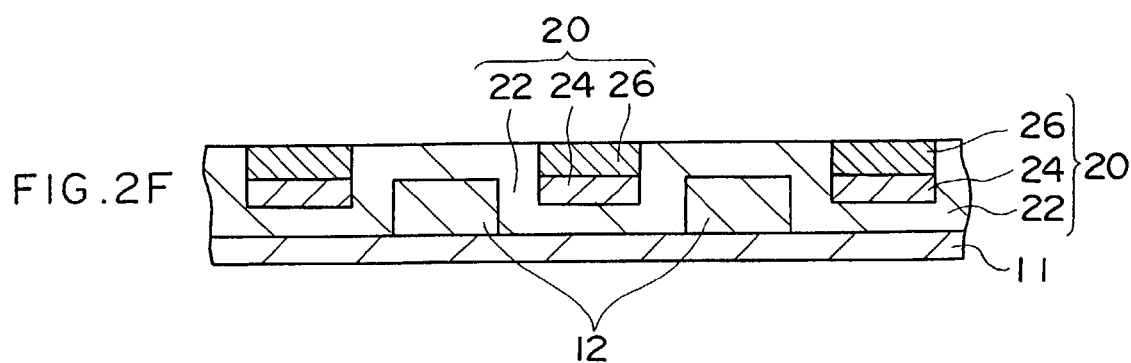
Figure 2G:
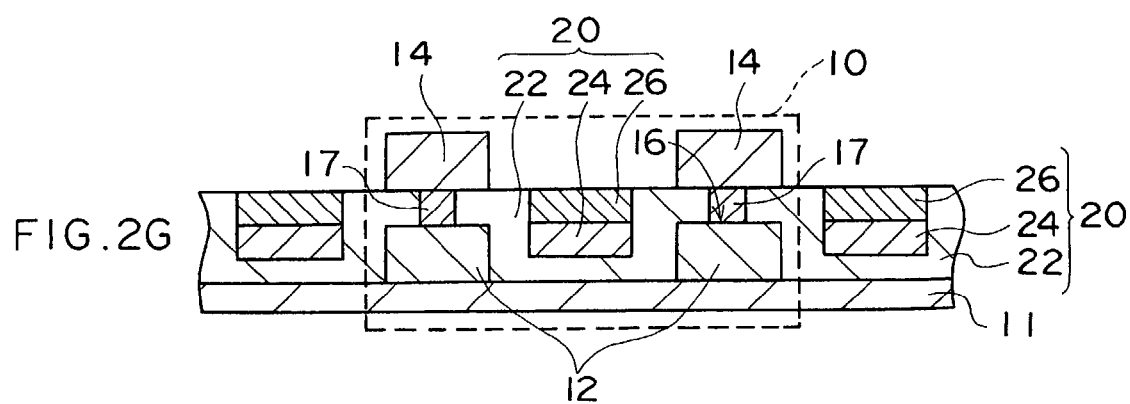

Then, the overall upper surface portion of the second preliminary layer 25 is removed until the top surfaces of the convex portions 22a are exposed, and is planarized (FIG. 2F). The step of planarizing can be also achieved by using a well-known method, for example, a CMP method or an etch back method. The residues of the second preliminary layer 25 are the cap insulating films 26.

The via-holes 16 are formed so as to pass through portions of the inter-layer insulating film 20, which locate on the first wires 12, and reach the first wires 12. Thereafter, the members 17 are respectively embedded in the via-holes 16.

After that, the second wires 14 are provided to be electrically connected to the first wires 12 via the members 17 embedded in the via-holes 16.

As described above, in the first embodiment, the structure of the semiconductor device comprising two wire-layers, i.e., the first wires 12 and the second wires 14, and the method for fabricating the semiconductor device have been described as an example.

For example, in a case where a semiconductor device comprising three or more wire-layers is fabricated, after the step of providing the second wires 14, similar steps from forming the liner insulating film 22 to providing further wires are repeated. In this manner, if a series of steps which are similar to those shown in FIGS. 2A to 2G are repeated, a semiconductor device comprising even more wire-layers can be fabricated.

In accordance with the structure including multiple wire-layers in the first embodiment, since the buried insulating films, whose dielectric constant is lower than that of the other insulating films in the vicinities thereof, are provided in the inter-layer insulating film, capacitance between the upper wire-layer and the lower wire-layer can be reduced.

Further, since the buried insulating films are buried in the inter-layer insulating film and respectively between the mutually adjacent wires in the same layer, capacitance therebetween (fringing capacitance) can be reduced. Thus, operation of the semiconductor device comprising the structure especially including many wire-layers can be stabilized and accelerated.

Furthermore, since the insulating material for the buried insulating films can be sealed in the inter-layer insulating film, operation failure of the semiconductor device can be prevented even when a corrosive material such as fluorine is used as the insulating material.

In accordance with the fabrication method in the first embodiment, the structure including multiple wire-layers therein can be efficiently and easily formed.

Second Embodiment

Figure 3:
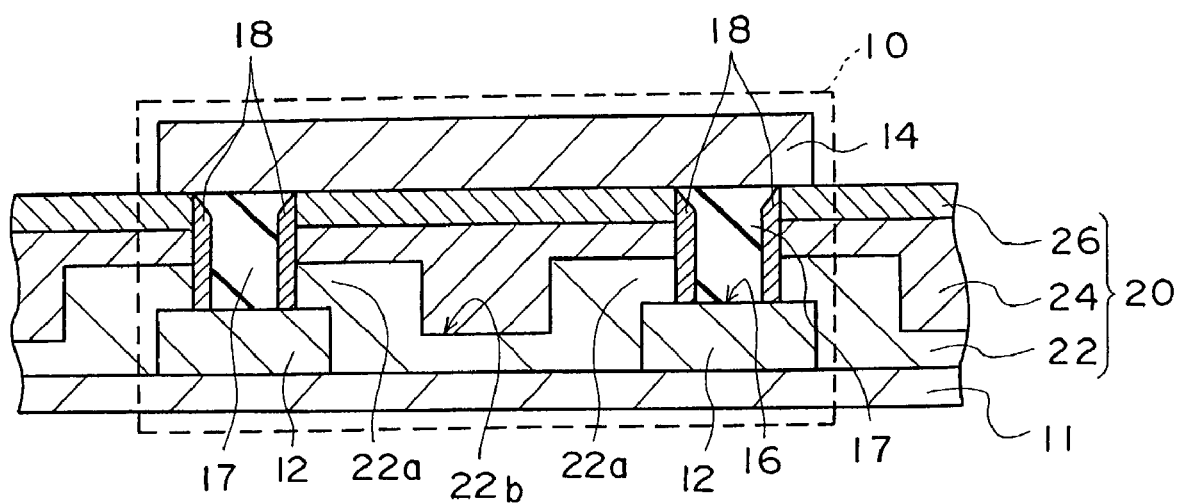
FIG. 3 is a schematic cross-sectional view showing a structure including multiple wire-layers in a second embodiment of the present invention.

A semiconductor device in a second embodiment will be described referring to FIG. 3. FIG. 3 is a schematic cross-sectional view showing the semiconductor device in the second embodiment.

The semiconductor device in the second embodiment has a structure 10 including multiple wire-layers in the same manner as in the first embodiment. In the structure 10 including multiple wire-layers, a plurality of first wires 12 are provided on an underlying layer 11. An inter-layer insulating film 20 is provided on the first wires 12, and a second wire (layer) 14 is further provided on the inter-layer insulating film 20.

The inter-layer insulating film 20 comprises a liner insulating film 22 which coats the plurality of first wires 12 provided on the underlying layer 11 so as to have convex portions 22a and concave portions 22b in the same manner as in the first embodiment, a buried insulating film 24 which is provided on the liner insulating film 22, and a cap insulating film 26 which coats the buried insulating film 24.

The inter-layer insulating film 20 further comprises via-holes 16 which are formed so as to pass through the cap insulating film 26, the buried insulating film 24 and the liner insulating film 22, and respectively reach the first wires 12, side walls 18 which coat side portions 16a of the respective via-hole 16, and embedded members 17 which are respectively embedded in the via-holes 16 coated with the side walls 18.

The second wire (layer) 14 is provided on the cap insulating film 26 so as to connect to the embedded members 17.

The first wires 12 and the second wire 14 are made of a conductive material. The material is not particularly limited, but is preferably a metal such as gold, aluminum or copper.

As described above in the first embodiment, materials for the liner insulating film 22 and the cap insulating film 26 forming the inter-layer insulating film 20 are not particularly limited, and can be properly selected as long as their use does not hinder the object of the present invention. The materials for the liner insulating film 22 and the cap insulating film 26 may be the same.

In the same manner as in the first embodiment, an insulating material having a dielectric constant, which is lower than that of conventionally used insulating materials, and than that of insulating materials used for the liner insulating film 22 and the cap insulating film 26 in the vicinity of the buried insulating film 24, is used for forming the buried insulating film 24. The dielectric constant of the insulating material for the buried insulating film 24 is preferably as low as possible. However, taking into consideration availability of the insulating material, the dielectric constant is preferably within a range from 2.0 to 3.3, for example.

Specifically, preferable examples of the insulating material for the buried insulating film 24 include insulating materials containing fluorine (FSG), a borazine-silicon polymer and the like. More preferably, the insulating material for the buried insulating film 24 is selected from the insulating materials containing fluorine (FSG).

The side walls 18 are made of a material whose dielectric constant is higher than that of the buried insulating film 24.

The embedded members 17 for electrically connecting the first wires 12 to the second wire 14 are respectively provided in spaces surrounded by the side walls 18, i.e., in the via-holes 16 provided with the side walls 18. A material for the embedded members 17 is preferably tungsten (W).

A method for fabricating the semiconductor device in the second embodiment will now be described referring to FIGS. 4A to 4F.

FIGS. 4A to 4F are intended to explain each step of fabricating the semiconductor device (structure including multiple wire-layers) in the second embodiment. These figures show cross-sections of the structure obtained at each step.

Figure 4A:
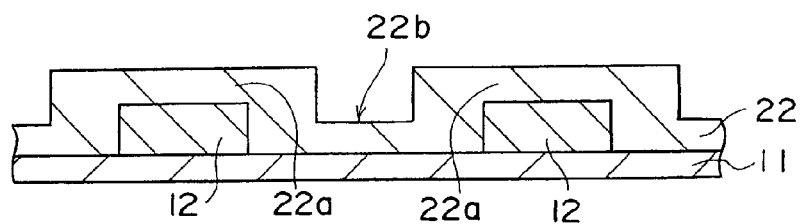
FIGS. 4A to 4F are cross-sectional views showing each step of a method for forming the structure including multiple wire-layers shown in FIG. 3.

In accordance with the method for fabricating the semiconductor device in the second embodiment of the present invention, initially, the first wires 12 are provided on the underlying layer 11. Thereafter, the liner insulating film 22 is formed on the first wires 12 and the underlying layer 11 so that the concave portions 22b are respectively formed between the mutually adjacent first wires 12 and the convex portions 22a are respectively formed on the first wires 12 (FIG. 4A).

Then, the buried insulating film 24 is provided on the liner insulating film 22 which has been formed. Further, the top surface of the buried insulating film 24 is planarized by using, for example, a CMP method.

Figure 4B:
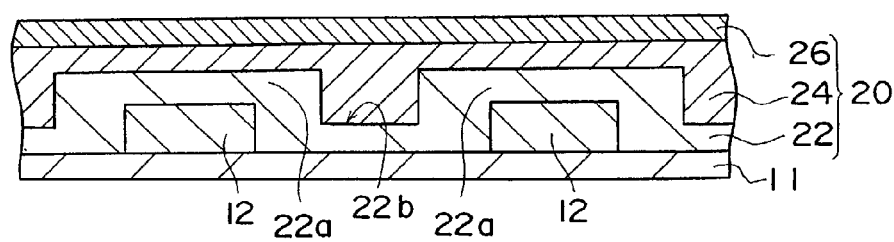

Subsequently, the buried insulating film 24 is coated with the cap insulating film 26. Further, the top surface of the cap insulating film 26 is planarized (FIG. 4B).

Figure 4C:
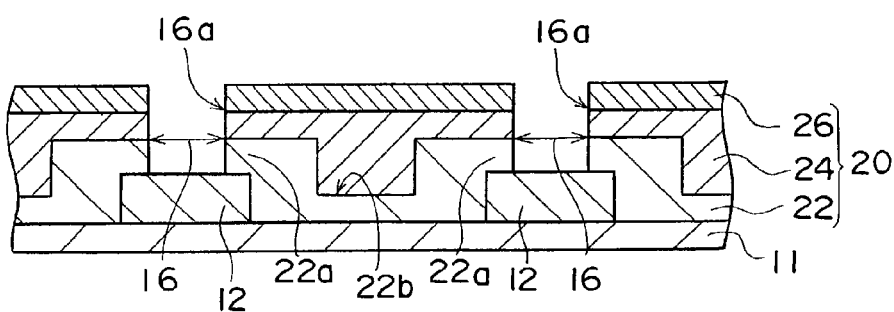

After that, the via-holes 16 are formed so as to pass through the inter-layer insulating film 20 and reach the first wires 12 (FIG. 4C).

Figure 4D:
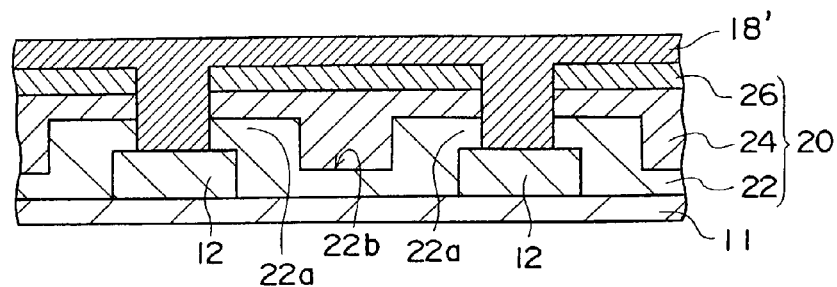

The via-holes 16 are then filled, in other words, the side portions 16a of the via-holes 16 and the top surface of the cap insulating film 26 are coated, with a preliminary side wall layer 18' for forming the side walls 18 (see FIGS. 4E and 4F) later (FIG. 4D).

An insulating material for forming the preliminary side wall layer 18' may be selected from any insulating materials that are not disadvantageously affected by corrosion due to a corrosion factor such as the above-described fluorine contained in the buried insulating film 24, and is not particularly limited. The preliminary side wall layer 18' may be, for example, a nitrided film.

Figure 4E:
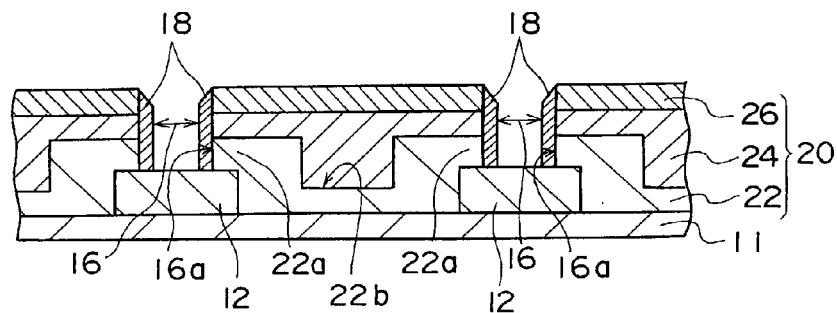

Then, the preliminary side wall layer 18' is etched so that the via-holes 16 reach the first wires 12, and so that the cap insulating film 26 is exposed and the preliminary side wall layer 18' is left only at the side portions 16a of the via-holes 16 to form the side walls 18. The etching is preferably anisotropic dry etching (FIG. 4E).

As described above in the first embodiment, for example, in the case where the buried insulating film 24 is made of an insulating material containing a corrosion factor for metal wires, such as the fluorine, there is a risk that the fluorine leaks out and corrodes the metal forming the first wires 12 and/or the second wire 14, thereby resulting in operation failure of the semiconductor device. Therefore, in order to avoid the risk, the buried insulating film 24 is formed so as not to contact the first wires 12, the second wire 14 and the embedded members 17 for the via-holes 16. Namely, the side walls 18 are provided in order to separate the buried insulating film 24 from the first wires 12, the second wire 14 and the embedded members 17.

Therefore, the side walls 18 should be thick enough to prevent the buried insulating film 24 from contacting the first wires 12, the second wire 14 and the embedded members 17, and yet not so thick as to make the side walls 18 completely fill the via-holes 16.

Figure 4F:
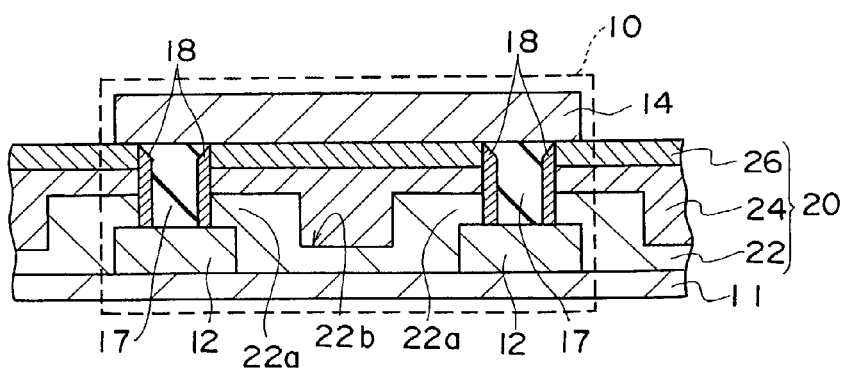
Figure 5:
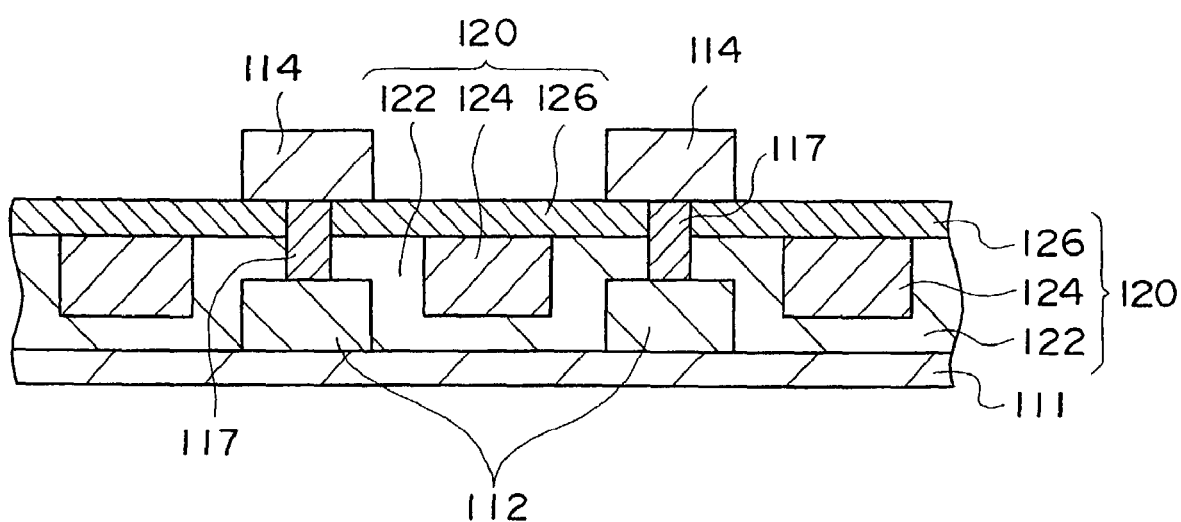
FIG. 5 is a schematic cross-sectional view explaining a prior art.

Next, the members 17 are respectively embedded in the via-holes 16, whose insides have been coated with the side walls 18. Further, the second wire 14 is provided on the cap insulating film 26 so as to be electrically connected to the first wires 12 via the members 17 embedded in the via-holes 16 (FIG. 4F).

In the second embodiment, in the same manner as in the first embodiment, the structure of the semiconductor device comprising two wire-layers, i.e., the first wires 12 and the second wire 14, and the method for fabricating the semiconductor device have been described as an example. For example, in a case where a semiconductor device comprising three or more wire-layers is fabricated, after the step of providing the second wire 14, similar steps from forming the liner insulating film 22 to providing another wire (layer) are repeated. In this manner, if a series of steps which are similar to those shown in FIGS. 4A to 4F are repeated, a semiconductor device comprising even more wire-layers can be fabricated.

In accordance with the structure including multiple wire-layers in the second embodiment, in the same manner as in the first embodiment, capacitance respectively between the mutually adjacent wires in the same layer (fringing capacitance) can be reduced.

In the second embodiment, the buried insulating film 24 is extended overall in the inter-layer insulating film 20, except the portions thereof connecting the first wires 12 to the second wire 14 via the via-holes 16 (embedded members 17), so as to efficiently insulate the first wires 12 from the second wire 14. Therefore, as compared with the first embodiment, capacitance between the first wires 12 and the second wire 14 can be much more reduced. Accordingly, operation of the semiconductor device comprising the structure including multiple wire-layers can be further stabilized to improve the reliability thereof, and can be further accelerated.

Further, in the second embodiment, the buried insulating film 24 is separated from the first wires 12, the second wire 14 and the embedded members 17 by the liner insulating film 22, the cap insulating film 26 and the side walls 18. As a result, operation failure of the semiconductor device due to corrosion can be prevented, even when an insulating material containing a corrosive factor such as the fluorine is used. Furthermore, without predetermining positions where the via-holes 16 are formed, the positions can be properly determined during the fabrication process.

In accordance with the method for forming the structure including multiple wire-layers in the second embodiment, the structure including multiple wire-layers therein can be efficiently and easily formed.

What is claimed is:

1. A method for forming a structure including multiple wire-layers comprising:
   providing a plurality of wires on an underlying layer;
   forming an interlayer insulating layer that covers the plurality of wires and the underlying layer, the interlayer insulating layer having pockets therein that extend between the plurality of wires;
   partially filling the pockets with a first insulating material that covers bottom surfaces of the pockets;
   forming a cap insulating material on the first insulating material, the cap insulating material being confined within the pockets;
   forming via holes through the interlayer insulating layer that expose the plurality of wires;
   filling the via holes with conductive members; and
   providing second wires directly on the interlayer insulating layer as electrically connected to the plurality of wires by the conductive members.

2. The method for forming a structure of claim 1, wherein a dielectric constant of the first insulating material is lower than a dielectric constant of the interlayer insulating layer and a dielectric constant of the cap insulating material.

3. The method for forming a structure of claim 1, wherein the first insulating material contains fluorine.

4. A method for forming a structure including multiple wire-layers, comprising:
   preparing an underlying layer;
   providing a plurality of first wires on the underlying layer;
   forming a liner insulating film on the underlying layer provided with the plurality of first wires, so that concave portions are respectively formed in the liner insulating film between the first wires which are adjacent to each other, and so that convex portions of the liner insulating film are respectively formed on the first wires;
   providing a first insulating material on the liner insulating film;
   planarizing a top surface of the first insulating material so that the convex portions are exposed and the first insulating material remains in the concave portions, so as to form buried insulating films;
   providing a second insulating material so as to coat the exposed liner insulating film and the buried insulating films;
   planarizing a top surface of the second insulating material so that the convex portions are exposed and the buried insulating films are coated, so as to form cap insulating films;
   forming via-holes that pass through the liner insulating film so as to reach the first wires, and filling the via-holes with conductive embedded members; and
   providing second wires directly on the liner insulating film so as to be electrically connected to the first wires via the embedded members,
   wherein a dielectric constant of the first insulating material is lower than a dielectric constant of the liner insulating film and a dielectric constant of the cap insulating films.

5. The method for forming a structure including multiple wire-layers of claim 4, further comprising reducing by anisotropic etching a thickness of the buried insulating films formed in the concave portions, so that the thickness of the buried insulating films is thinner than a depth of the concave portions, after said planarizing the top surface of the first insulating material.

6. The method for forming a structure including multiple wire-layers of claim 4, wherein the first insulating material has a dielectric constant within a range from 2.0 to 3.3.

7. The method for forming a structure including multiple wire-layers of claim 5, wherein the first insulating material has a dielectric constant within a range from 2.0 to 3.3.

8. The method for forming a structure including multiple wire-layers of claim 5, wherein the first insulating material contains fluorine.

9. The method for forming a structure including multiple wire-layers of claim 4, wherein said planarizing the top surface of the first insulating material is achieved by chemical mechanical polishing.

10. The method for forming a structure including multiple wire-layers of claim 4, wherein said planarizing the top surface of the second insulating material is achieved by chemical mechanical polishing.

11. The method for forming a structure including multiple wire-layers of claim 4, wherein said planarizing the top surface of the first insulating material is achieved by an etch back.

12. The method for forming a structure including multiple wire-layers of claim 4, wherein said planarizing the top surface of the second insulating material is achieved by an etch back.

13. The method for forming a structure including multiple wire-layers of claim 4, wherein the first insulating material contains a corrosive ingredient, the liner insulating film prevents corrosion of the plurality of first wires due to leakage of the corrosive ingredient, and the cap insulating films prevent corrosion of the second wires due to leakage of the corrosive ingredient.

14. A method for forming a structure including multiple wire-layers, comprising:
preparing an underlying layer;
providing a plurality of first wires on the underlying layer;
forming a liner insulating film over the underlying layer provided with the plurality of first wires, so that concave portions are respectively formed in the liner insulating film between the first wires which are adjacent to each other, and so that convex portions of the liner insulating film are respectively formed over the first wires;
providing a first insulating material on the liner insulating film;
planarizing a top surface of the first insulating material;
forming a cap insulating film so as to coat the planarized first insulating material;
forming via-holes that pass through the cap insulating film, the planarized first insulating material, and the liner insulating film so as to reach the first wires;
filling the via-holes and coating a top surface of the cap insulating film with a second insulating material;
etching the second insulating material so as to form side walls at side portions of the via-holes and to expose top surfaces of the first wires at bottom portions of the via-holes;
filling the via-holes with conductive embedded members; and
providing a second wire layer on the cap insulating film so as to be electrically connected to the first wires via the conductive embedded members,
wherein a dielectric constant of the first insulating material is lower than a dielectric constant of the liner insulating film and a dielectric constant of the cap insulating film, the first insulating material contains a corrosive ingredient, the liner insulating film prevents corrosion of the plurality of first wires due to leakage of the corrosive ingredient, and the cap insulating film prevents corrosion of the second wire layer due to leakage of the corrosive ingredient.

15. The method for forming a structure including multiple wire-layers of claim 14, wherein the first insulating material has a dielectric constant within a range from 2.0 to 3.3.

16. The method for forming a structure including multiple wire-layers of claim 15, wherein the first insulating material contains fluorine.

17. The method for forming a structure including multiple wire-layers of claim 14, wherein the second insulating material is nitride.

18. The method for forming a structure including multiple wire-layers of claim 14, wherein said planarizing the top surface of the first insulating material is achieved by chemical mechanical polishing.

19. The method for forming a structure including multiple wire-layers of claim 14, wherein said planarizing the top surface of the first insulating material is achieved by an etch back.

20. The method for forming a structure including multiple wire-layers of claim 14, wherein said etching the second insulating material is achieved by anisotropic etching.

* * * * *